United States Patent
Nitsche et al.

(10) Patent No.: US 10,890,167 B2
(45) Date of Patent: Jan. 12, 2021

(54) METHOD FOR OPERATING A PISTON PUMP, CONTROL DEVICE OF A PISTON PUMP, AND PISTON PUMP

(71) Applicant: Robert Bosch GmbH, Stuttgart (DE)

(72) Inventors: Frank Nitsche, Remseck am Neckar (DE); Thorsten Allgeier, Untergruppenbach (DE); Walter Maeurer, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 587 days.

(21) Appl. No.: 15/546,140

(22) PCT Filed: Sep. 2, 2015

(86) PCT No.: PCT/EP2015/070063
§ 371 (c)(1),
(2) Date: Jul. 25, 2017

(87) PCT Pub. No.: WO2016/119918
PCT Pub. Date: Aug. 4, 2016

(65) Prior Publication Data
US 2018/0340522 A1     Nov. 29, 2018

(30) Foreign Application Priority Data

Jan. 28, 2015 (DE) .......... 10 2015 201 463

(51) Int. Cl.
F04B 17/04 (2006.01)
F02D 41/20 (2006.01)
H01L 29/866 (2006.01)

(52) U.S. Cl.
CPC ............ *F04B 17/044* (2013.01); *F02D 41/20* (2013.01); *F04B 17/042* (2013.01);
(Continued)

(58) Field of Classification Search
CPC ..... F02D 2041/2034; F02D 2041/2041; F02D 2041/2051; F02D 41/20; F02D 2041/2027;
(Continued)

(56) References Cited

U.S. PATENT DOCUMENTS

| | | | |
|---|---|---|---|
| 5,941,216 A * | 8/1999 | Arakawa | F02D 41/20 |
| | | | 123/490 |
| 6,269,784 B1 * | 8/2001 | Newton | F01L 9/04 |
| | | | 123/90.11 |
| 9,121,360 B2 * | 9/2015 | Richter | F02D 41/2464 |
| 9,412,508 B2 * | 8/2016 | Koch | H01F 7/1844 |
| 9,683,509 B2 * | 6/2017 | Maess | H01F 7/1883 |

(Continued)

FOREIGN PATENT DOCUMENTS

| | | |
|---|---|---|
| CN | 2125731 U | 12/1992 |
| CN | 102245881 A | 11/2011 |

(Continued)

OTHER PUBLICATIONS

International Search Report for Application No. PCT/EP2015/070063 dated Nov. 24, 2015 (English Translation, 3 pages).

*Primary Examiner* — Jared Fureman
*Assistant Examiner* — Nicolas Bellido
(74) *Attorney, Agent, or Firm* — Michael Best & Friedrich LLP

(57) ABSTRACT

The invention relates to a method for operating a piston pump, which is driven by means of a coil (1) of an electromagnet, wherein a piston (2) of the piston pump can be moved against a restoring force by means of the electromagnet, wherein a voltage (U) is applied to the coil (1) during a switch-on duration such that a current (I) flows through the coil (1) and the piston (2) is accelerated, wherein two different quenching methods are used for the current (I) in the coil (1).

14 Claims, 7 Drawing Sheets

(52) U.S. Cl.
CPC .... *H01L 29/866* (2013.01); *F02D 2041/2034* (2013.01); *F02D 2041/2041* (2013.01); *F02D 2041/2051* (2013.01)

(58) Field of Classification Search
CPC ......... F02D 2041/2037; F02D 2200/06; F02D 41/2464; F02D 41/26; F02D 41/3809; F02D 41/3845; F04B 17/04; F04B 17/042; F04B 17/044; F04B 39/0016; F04B 53/12; H01L 29/866; G05D 7/0635
See application file for complete search history.

(56) References Cited

U.S. PATENT DOCUMENTS

| | | | |
|---|---|---|---|
| 2013/0034459 A1* | 2/2013 | Mueller | F04B 17/046 417/559 |
| 2018/0023557 A1* | 1/2018 | Krusch | F02D 41/20 417/12 |

FOREIGN PATENT DOCUMENTS

| | | | | |
|---|---|---|---|---|
| CN | 102705193 A | | 10/2012 | |
| DE | 10201453 | | 5/2003 | |
| DE | 10201453 A1 | * | 5/2003 | ................ B60T 8/36 |
| DE | 102010013106 | | 9/2011 | |
| DE | 102012211798 | | 1/2014 | |
| EP | 1154140 | | 11/2001 | |
| EP | 1291256 A2 | | 3/2003 | |
| JP | 58214081 A | * | 12/1983 | ............. F16K 31/02 |
| JP | 2004247877 A | | 9/2004 | |
| JP | 2005291213 A | | 10/2005 | |
| JP | 2009047035 A | * | 3/2009 | |
| JP | 2009047035 A | | 3/2009 | |
| JP | 2011144795 A | | 7/2011 | |
| KR | 20100117243 A | | 11/2010 | |
| WO | 2005045255 A2 | | 5/2005 | |
| WO | WO-2011012518 A1 | * | 2/2011 | ............. F02D 41/20 |

* cited by examiner

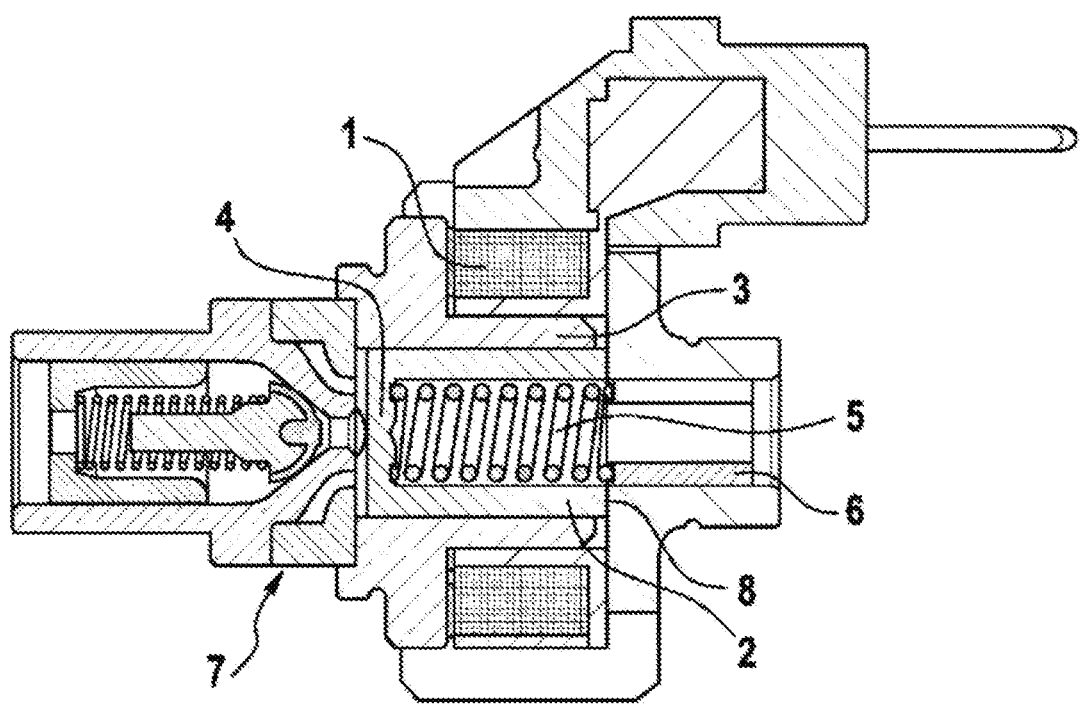
--PRIOR ART-- FIG. 1

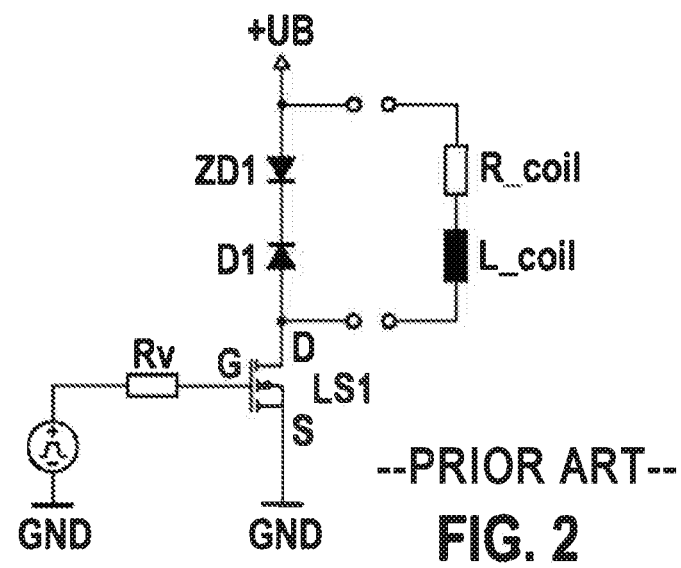
--PRIOR ART--  FIG. 2
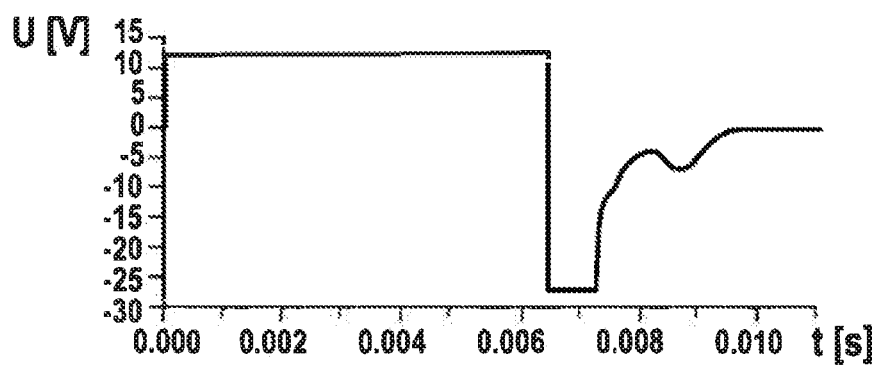
--PRIOR ART--  FIG. 3
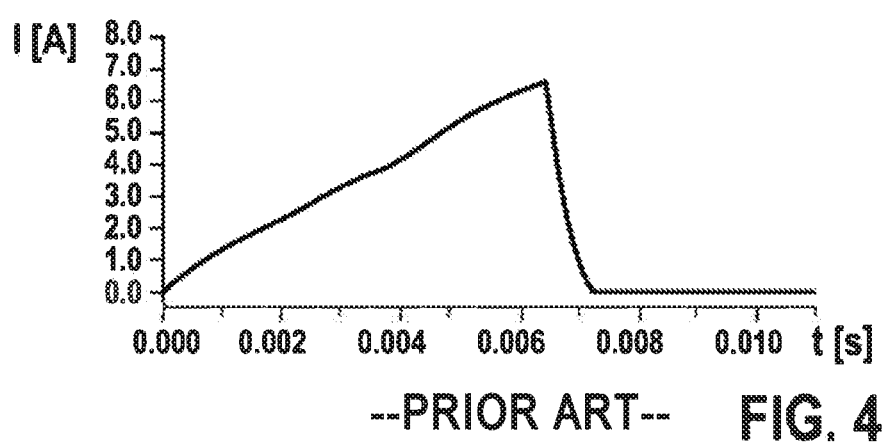
--PRIOR ART--  FIG. 4

METHOD FOR OPERATING A PISTON PUMP, CONTROL DEVICE OF A PISTON PUMP, AND PISTON PUMP

BACKGROUND OF THE INVENTION

The present invention relates to a method for operating a piston pump which is driven by means of a coil of an electromagnet, wherein a piston of the piston pump can be moved against a restoring force by means of the electromagnet. During a switch-on period, a voltage is applied to the coil, so that said voltage drives a current through the coil. The coil produces magnetic forces and accelerates the piston. The invention further relates to a drive device for the piston pump, and to a piston pump comprising a drive device.

Piston pumps which can be driven by means of the coil of an electromagnet are known from the prior art. Said piston pumps can be used, for example, as fuel pumps. By way of example, one embodiment of a pump of this type as a lifting armature pump is illustrated in FIG. 1. The piston pump comprises a coil 1, a piston 2 having a piston head 4, a cylinder 3, a helical spring 5 having an abutment 6 and a valve unit 7. When a current flows in the coil 1, a magnetic flux is produced through the interior of said coil. Consequently, the piston 2 is magnetically repelled from the valve unit 7, as a result of which the helical spring 5 is pretensioned against its abutment 6. The volume between the valve unit 7 and the piston head 4 expands, thereby resulting in an intake process. Significantly, after the working stroke reaches a maximum position at a stop 8, the current in the coil 1 is switched off, so that the piston remains at the stop 8 in order to allow the intake process to be executed in full. By the pretensioning of the helical spring 5, the piston 2 is then moved in the direction of the valve unit 7, as a result of which a discharge process occurs, in which discharge process the fluid to be pumped is displaced into the valve unit 7. A pump in which discharge is executed by means of a magnetic action and intake is executed by means of a spring action is also conceivable. By way of example, a lifting armature piston pump of this kind can be used as a fuel pump for an internal combustion engine.

The pump is generally driven by means of an electrical square-wave voltage with a prespecified drive frequency and switch-on period for each pump stroke, and rapid quenching. Driving the pump in this way generates a current flow in the coil, which current flow, owing to the magnetic effect of the coil, continues to flow even when a driving voltage is taken away. Decay of this current depends on the resistance in a freewheeling circuit via which the current in the coil continues to flow during decay. This is called the "quenching process". Rapid quenching can be implemented by the current being conducted via a component which rapidly converts the energy in the coil into heat. However, only a small amount of energy can be drawn from the coil when there is a short circuit or a very high resistance. Therefore, a suitable impedance for rapid quenching is required. Instead of a non-reactive resistor, a semiconductor resistor can also be used. A drive circuit for these processes is shown in FIG. 2 as prior art. The circuit used has a semiconductor switch by means of which current is applied to the coil in a first operating state and freewheeling of the coil is switched via a Zener diode in a second operating state, this leading to rapid quenching of the current through the coil by conversion of the energy from the coil into heat at the Zener diode. FIG. 3 illustrates the profile of the voltage U across the coil with respect to time t in seconds. After a switch-on period, a voltage dip, which runs towards the voltage zero owing to the withdrawal of energy from the coil over time, takes place after the end of said switch-on period. FIG. 4 illustrates the current I through the coil over the same time period which is also illustrated in FIG. 3. The current I rises during the switch-on period of the voltage U and falls sharply after the end of said switch-on period is reached, so that it is zero after a short time. One disadvantage of this solution is that the current is abruptly quenched and the piston therefore remains in a sharply deflected position for only a short time. On account of the inertia of the hydraulic system, this time period may not be sufficient to optimally fill the pump volume under certain circumstances. In addition, in the event of intense current application and in an operating state with a relatively low hydraulic resistance, the piston may strike a stop, and this can lead to a considerable development of noise.

Current-controlled output stages, which are extremely costly, are also known.

SUMMARY OF THE INVENTION

In order to overcome the abovementioned disadvantages, it is proposed, according to the invention, to use two different quenching methods for the current in the coil. A second quenching method considerably increases the options for switching off the current, but is not as expensive as current control. It is conceivable to also use more than two different quenching methods for the current of the coil.

By way of example, the piston can first be accelerated, as a result of which it reaches a stop. A first quenching method can have the effect, for example, that the piston is held at the stop. This can have the effect that the fluid to be pumped has enough time to fill the pumping volume. In this way, the volumetric efficiency of the pump is improved, wherein a volumetric efficiency is understood to be the ratio of a fluid volume actually present in the cylinder in relation to the theoretically maximum possible filling. In order to implement rapid release of the piston from the stop after a holding time, it is possible to use, for example, a second, different quenching method which rapidly quenches the current in the coil. On account of the restoring force, the piston then moves to a position from which it is again accelerated in the direction of the stop.

In one embodiment, it is proposed that, after the acceleration of the piston, first a weak quenching method and then a strong quenching method are used. A weak quenching method is a quenching method in which the current through the coil decreases only slowly. Accordingly, the magnetic force generated by the coil also decreases only slowly. To this end, there can be a low resistance, in particular at least approximately a short circuit, in the freewheeling circuit. In contrast, a strong quenching method has the effect that the current through the coil decreases considerably more rapidly than in the case of a weak quenching method. As a result, the magnetic force which is generated by the coil can be reduced more rapidly than in the case of a weak quenching method. To this end, an impedance can be provided in the freewheeling circuit, at which impedance a high electrical power is converted into heat at the existing voltage and the existing current. The impedance can also be provided by a semiconductor junction. In many lifting armature piston pumps, the magnetic force along the path of the piston is progressive, wherein it is greatest at the stop. Therefore, a low current through the coil is sufficient at the stop in order to hold the piston at the stop. Therefore, if only a small amount of energy is drawn from the coil owing to the weak quenching method, this is sufficient to keep the piston at the stop. In a further embodiment, it is conceivable for the weak quenching method to be used while the piston is still moving toward the stop. The piston reaches the stop owing to its mass inertia and, under certain circumstances, also owing to a magnetic effect of the coil which remains during application of the weak quenching method. In order to release the piston from the stop, a strong quenching method is used, which strong quenching method causes a sharp drop in the current through the coil. The option of releasing the piston from the stop even in different operating states easily in a defined manner makes it possible to control the pump in a very flexible and effective manner. In particular, the time of application of the weak and of the strong quenching method can be set such that a pumping behavior which is as optimal as possible is produced.

In a further embodiment, the behavior of the pump can further be optimized by a time at which the piston begins to move and, in response to this, the switch-on period is ended being ascertained by means of a measurement method. The energy content which is then stored in the coil is preferably sufficient for the resulting magnetic effect to move the piston as far as the stop. The magnetic energy which is generated by the coil is effectively utilized by a method of this kind. Ending the switch-on period when a movement of the piston is identified is advantageous because a movement of the piston in comparison to a stationary state of said piston can be very easily detected, in particular as a back emf begins in the coil, which back emf results from the piston movement. Before its movement, the piston preferably bears against a rest stop which is different from the abovementioned stop.

In one embodiment of the method, the coil is short-circuited via a semiconductor switch in the weak quenching method. The current flowing in the coil can therefore run across the freewheeling circuit, this leading to a relatively low level of energy loss from the coil. The resistance of the open semiconductor switch and the internal resistance of the coil and possibly significant line resistances convert a portion of the energy of the coil into heat. Overall, this results in a slow drop in the current intensity through the coil, preferably to a similar extent as the current increase during the switch-on period.

In a further embodiment, in order to carry out the strong quenching method, the coil is connected into a freewheeling circuit in which a resistor at which energy from the coil is converted into heat to a considerable extent is arranged. This leads to a sharp drop in the current intensity in the coil. In this sense, a resistor is also a semiconductor contact resistor, for example that of a Zener diode. Strong current quenching can also be achieved when a semiconductor switch, via which a freewheeling circuit runs, is switched to a semi-conducting state, so that it has a resistor at which energy from the coil is converted into heat to a considerable extent.

As an alternative or in addition to the embodiment last described above, it is conceivable, in the strong quenching method, to feed current from the coil into a current supply device which is, in particular, a current supply device from which current for the coil has been drawn during the switch-on period. This is then energetic recovery.

The coil can also be connected into an H bridge, wherein the coil is arranged between the voltage divider points of the two branches. The end points of the branches are connected to one another. A supply voltage, which preferably originates from a current supply device, is applied between the end points of the two branches of the H bridge. DC voltage is preferably applied. At least one semiconductor switch is connected into each of the two branches, wherein one of the semiconductor switches is connected in a branch element with connection to the supply voltage and one is connected in a branch element with connection to ground. In this variant, a diode which is reverse-biased with respect to the supply voltage is arranged in each of the remaining two branch elements from the voltage divider points to the respectively other end points of the branches. During the switch-on period, the two semiconductor switches are switched so as to be conductive, so that current can flow across said switches and the coil. In order to carry out the weak quenching method, one of the semiconductor switches is closed, while the other is open. A freewheeling circuit can then be formed by means of the open semiconductor switch and one of the diodes. In order to recover current from the coil into a current supply device, both semiconductor switches are opened. The coil current causes an increase in voltage across the coil, and this voltage increase drives a current through the two diodes and the current supply device.

In another variant with an H bridge, each of the diodes in the abovementioned branch elements is replaced by a semiconductor switch. The direction of the current can then be defined by the coil by, for one direction, the two semiconductor switches which are already present in the above-described basic variant being switched so as to be conductive while the additional semiconductor switches are switched off. For the other direction, the additional semiconductor switches can be switched so as to be conductive while the semiconductor switches of the basic variant are switched off. The function of the diodes for the freewheeling mode can be replicated by actively controlling these semiconductor switches. The semiconductor switches have the advantage that they can have a lower internal resistance than the diodes in the energetic recovery mode.

In a further variant which is based on the last-described variant, each of the semiconductor switches is provided with a freewheeling diode. The freewheeling diodes are reverse-biased with respect to the supply voltage and are each connected to the source and drain of their semiconductor switch. With this configuration, corresponding switching of the semiconductor switches can have the effect that, in a freewheeling circuit, either the internal resistance of the semiconductor switch or the resistance of the semiconductor junction of the diode or the resistance of the diode are effective in the reverse direction. This produces more options and operating modes. A weak quenching process can therefore be performed via a freewheeling circuit with two semiconductor switches which are switched so as to be conductive and which are both combined with the same end of the H bridge. In particular, the other two semiconductor switches are switched off in this case. On account of a preferably low resistance of a closed semiconductor switch, this resistance dominates the total resistance of the parallel circuit comprising the semiconductor switch and its freewheeling diode, so that the total resistance is low. A likewise weak quenching process with, however, a somewhat stronger quenching effect can be achieved by a closed semiconductor switch and a forward-biased diode, instead of one of the last-described two semiconductor switches, being connected into the freewheeling circuit. To this end, this second semiconductor switch, which is situated parallel to the conductive diode, can be switched off, so that the freewheeling current has to run across the freewheeling diode in spite of the relatively high diode voltage. The freewheeling circuit then has a somewhat higher resistance. That diode which is forward-biased in the freewheeling circuit is used for this purpose. Which diode this is depends on the current direction through the coil and on whether the freewheeling circuit runs in the branch elements at supply voltage potential or ground potential. A freewheeling circuit for the strong quenching method can be switched by all semiconductor switches being off. In this case, a freewheeling circuit is formed by means of two of the freewheeling diodes and the current supply device, the high energy absorption capacity of said current supply device leading to very rapid quenching of the coil current. The direction of the current through the coil determines which freewheeling diodes are turned on and which are turned off. In order to increase the degree of efficiency of the energetic recovery, the semiconductor switches which are situated parallel to the conducting diodes can be switched so as to be conductive, as an alternative.

An H bridge circuit for supplying current to the coil is preferably embodied as an integrated circuit on a chip.

In a manner of operation with recovery of energy into a current supply device, the time of activation of a weak quenching method is preferably shortened, so that the piston is only briefly held at the stop. Although the volumetric efficiency is then adversely affected to a certain extent, more energy can be fed back to the current supply device since less energy is converted into heat during the weak quenching method.

In a further embodiment, the length of the switch-on period and/or the holding period is adjusted depending on an operating point and/or a property of the pump. In particular, the length of the switch-on period and/or the holding period is adjusted depending on mechanical and/or hydraulic properties of the piston pump. The adjustment is preferably performed in such a way that the volumetric efficiency of the piston pump is as good as possible. An operating point is defined depending on the delivery quantity and the pumping frequency.

In a further embodiment, the length of the switch-on period is adjusted depending on the supply voltage of the piston pump and/or a resistance of the coil in such a way that a prespecified current flows in the coil after the end of the switch-on period. In this way, as much energy can be introduced into the coil as is, for example, sufficient to drive the piston as far as the stop and preferably to hold the piston at the stop for a sufficient length of time. In this case, a suitable switch-on period can be prespecified, so that the current does not have to be measured. However, as an alternative, a current measurement process is also conceivable. The formula $$t = -L/R \cdot \ln(1-(I \cdot R)/U))$$

can be used when calculating the switch-on period. In said formula, t denotes the switch-on period, L denotes the inductance of the coil, R denotes the internal resistance of the coil, U denotes the voltage which is applied to the coil, and I denotes the current intensity to be achieved.

In a further embodiment of the method, the temperature of the coil is ascertained and correction of the calculated time is carried out using the temperature information. In addition, a deviation in the resistance on account of temperature drift can be calculated and the temperature-corrected resistance value can be inserted into the abovementioned formula, so that a temperature-corrected switch-on period t is calculated. Calculating the change in a resistance due to temperature influence is part of the basic knowledge of a person skilled in the field of electrical engineering.

In a further embodiment, the piston pump is in the form of a fuel pump for an internal combustion engine. In order to save energy for operating the pump, the pumping frequency of the piston pump can be matched to a required quantity of fuel. In this case, the pumping frequency is preferably adjusted such that the piston pump delivers somewhat more fuel than the internal combustion engine requires. A considerable energy saving is made in comparison to a design with permanent full load of the pump. In addition or as an alternative, the delivery quantity of fuel can also be produced by adjusting the pump stroke. To this end, the switch-on period of the coil can be matched to a required quantity of fuel. In this case, the pump stroke is preferably adjusted such that the fuel pump delivers somewhat more fuel than the internal combustion engine requires. Calculation of the switch-on period can be executed, for example, in a controller of the internal combustion engine. The required minimum delivery volume flow for supplying the internal combustion engine can be calculated, for example, in the engine control system from the rotation speed, the injection time of the injectors and a stationary throughput at a given or modeled injection pressure. The following formula:

$$Q = a_{Cyl}/2 \cdot n_{eng} \cdot t_i \cdot Q_{Inj,stat}$$

where Q denotes a fuel delivery volume, $a_{Cyl}$ denotes the number of cylinders in the internal combustion engine, $n_{eng}$ denotes the rotation speed of the internal combustion engine, $t_i$ denotes the effective injection time and $Q_{Inj,stat}$ denotes a stationary fuel volume flow through an open injector, can be used for this purpose. The frequency of the piston pump is preferably not reduced to virtually zero in the event of very small required volume flows, but rather limited to a minimum frequency at which the pump continues to operate in a stable manner. The minimum frequency can be, for example, 30 Hz. The following formula:

$$f_{pump,opt} = f_{pump,max} \cdot Q_{engine}/Q_{pump,max}$$

can be used to match the pump frequency to the required fuel volume flow. In said formula, $f_{pump,opt}$ denotes an optimum pumping frequency, $f_{pump,max}$ denotes the maximum possible pumping frequency, for example 100 Hertz, $Q_{engine}$ denotes the fuel volume flow required for the internal combustion engine, and $Q_{pump,max}$ denotes the volume flow which the pump can deliver at a maximum.

Furthermore, it is known that the air gap in the magnetic circuit between the piston and, for example, a stop increases, because a greater piston stroke is required, in the case of a lifting armature piston pump at a constant frequency and increasing delivery volume flow. Accordingly, the required current, in order to attract the piston, is stronger. A correction factor can be used when matching the switch-on period of the coil to the fuel requirement of an internal combustion engine and therefore to the current required for this purpose. The correction factor can be calculated in advance and stored, for example, in an engine controller. In addition, single, some or all of the abovementioned drive parameters, in particular optimum drive parameters, can be either calculated in the engine controller during engine operation or stored in one or more characteristic maps depending on a variable, such as the operating voltage, the temperature of the coil and/or the required fuel volume flow for example. The driving can be accordingly parameterized by means of the calculated or called-up values.

In a further embodiment, the switch-on period, during which a voltage is applied to the coil, can be adjusted depending on a required volume flow. An increased volume flow can be achieved with an increased stroke of the pump, this requiring a longer switch-on period. The length of the switch-on period can be stored as a function of the volume flow.

In a further embodiment, the switch-on period can be adjusted depending on the voltage which is applied to the coil. The voltage which is applied to the coil is typically dependent on a supply voltage to the piston pump. As a result, there is a risk of the piston not being attracted in the case of an excessively low voltage and a switch-on period which has not been extended. An operating mode with a low level of power loss, in which the piston is magnetically moved, can be ensured by suitable selection of the switch-on period. To this end, the switch-on period can be adjusted depending on the coil voltage or the supply voltage.

In a further embodiment, a drive frequency of the piston pump, with which the pump executes pumping strokes, can be adjusted depending on a required volume flow. A corresponding relationship between the pumping frequency and the volume flow can be stored for use by means of the switching device. It is also conceivable to simultaneously adapt the switch-on period and the drive frequency depending on the required volume flow.

A further aspect of the invention proposes an electrical circuit arrangement for operating a piston pump which can be driven by means of a coil of an electromagnet and comprises a piston. According to the invention, the circuit arrangement has a semiconductor switch device comprising at least two semiconductor switches. The semiconductor switch device is designed to realize different operating modes or quenching methods of the piston pump. In this case, the semiconductor switch device can apply a voltage to the coil in a switch-on operating mode, this leading to a current flowing through the coil. To this end, the coil can be switched into a current path between a current source and a current sink of a current supply device. The piston is accelerated when current flows through the coil.

In a further operating mode of the semiconductor switch device, said semiconductor switch device has the effect that weak current quenching takes place in the coil. To this end, the coil can be disconnected from the current path for the switch-on operating mode and instead be short-circuited by means of one or more semiconductor switches. As already described above in relation to the method according to the invention, this leads to the current through the coil decreasing only slowly. In a third operating mode with strong current quenching, the semiconductor switch device is designed to connect the coil into a current path which comprises an energy absorption device. As a result, energy from the coil is transmitted to the energy absorption device.

In one embodiment of the circuit arrangement, the energy absorption device is in the form of an energy store which is suitable for absorbing energy from the circuit arrangement. In particular, said energy absorption device can be a capacitor and/or a battery or a rechargeable battery. The energy absorption device can also be an energy supply system to which other loads which can absorb energy are connected. The energy absorption device is particularly preferably an on-board supply system of a motor vehicle. In an alternative embodiment, the energy absorption device can be designed to convert absorbed energy into heat. Appropriate energy absorption devices can be, for example, a non-reactive resistor or a semiconductor junction.

A further embodiment proposes that the circuit arrangement is designed to execute one of the above-described methods.

A further aspect of the invention proposes a piston pump which, in a drive device, has an electrical circuit arrangement according to the above-described aspect. In this case, it is conceivable that the drive device is physically separated from the pump and is connected or can be connected to said pump by lines. It is also conceivable that parts of the drive device are arranged on the piston pump, while other parts are arranged remote from the piston pump. It is also conceivable that a part of the drive device is arranged on the piston pump, while another part is remote from the piston pump and is connected or can be connected to said piston pump by lines.

BRIEF DESCRIPTION OF THE DRAWINGS

Exemplary embodiments of the invention will be described in detail below with reference to the accompanying drawings, in which:

FIG. 1 shows a section through a lifting armature piston pump according to the prior art, FIG. 2 shows a drive circuit, known in the prior art, for a lifting armature piston pump, FIG. 3 shows a graph with a known profile of a voltage across a coil which is driven using the drive circuit from FIG. 2, FIG. 4 shows a graph with a known profile of a current with respect to time when driving the coil using the drive circuit from FIG. 2 over the same time period as in FIG. 3.

DETAILED DESCRIPTION

Figure 5A:
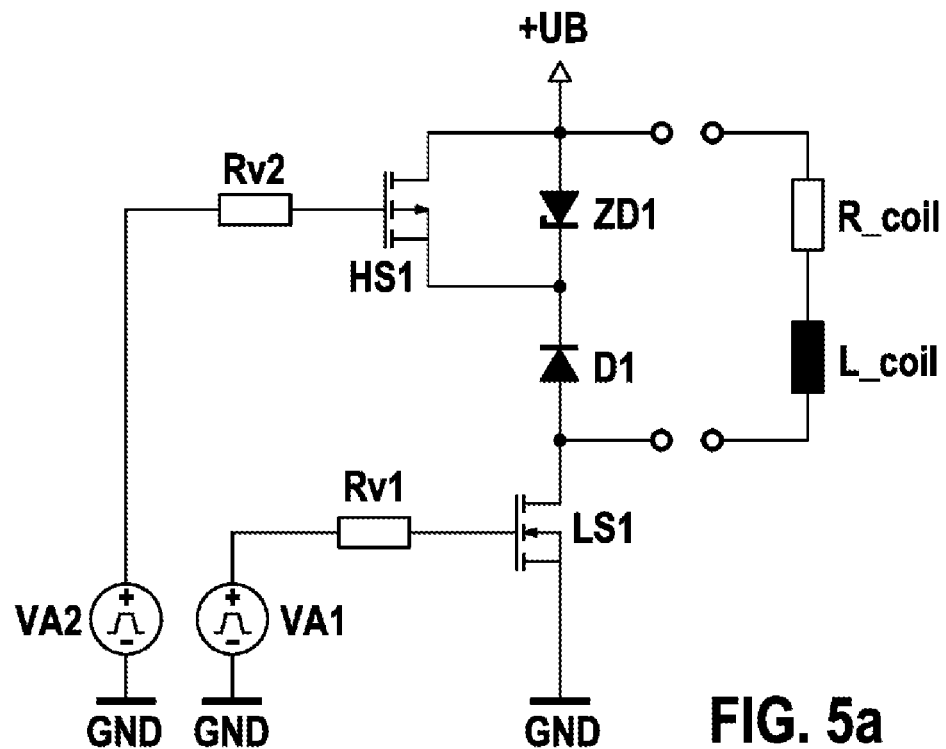
FIG. 5a shows a first embodiment of a drive circuit according to the invention.
Figure 7:
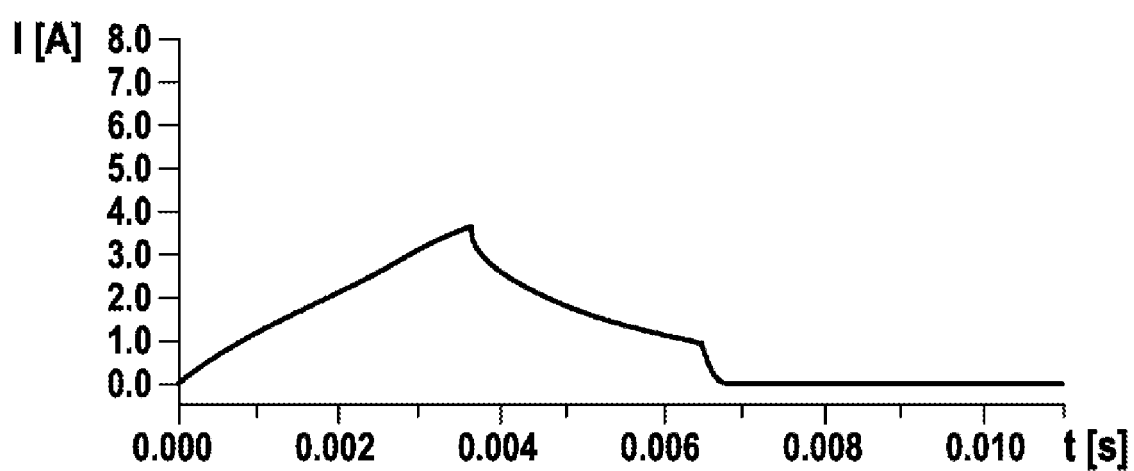
FIG. 7 shows a graph with a current flow with respect to time, which current flow results from the voltage, shown in FIG. 6, across the coil, wherein the same time period as in FIG. 6 is illustrated.

FIG. 5a schematically shows a circuit diagram of a drive circuit according to the invention. A current path from a positive supply voltage +UB to a ground connection GND is central to the circuit. Beginning at the supply voltage +UB, a forward-biased Zener diode ZD1, a conventional reverse-biased diode D1 connected in series with said forward-biased diode, and a first semiconductor switch LS1 connected in series with said conventional diode are arranged in said current path. A second semiconductor switch HS1 is connected in parallel with the Zener diode ZD1. A coil L_coil and an internal resistance R_coil can be connected to the current path by it being possible for the coil to be connected in parallel with a series circuit comprising the diodes ZD1 and D1. The semiconductor switch HS1 is preferably in the form of a p-channel MOSFET. Said semiconductor switch can be driven by means of a drive voltage VA2 via a series resistor Rv2. The semiconductor switch LS1 is preferably a self-locking n-channel MOSFET. Said semiconductor switch can be driven by means of a drive voltage VA1 via a series resistor Rv1. In a switch-on mode in which voltage is applied to the coil so that there is an increasing current flow in said coil, the semiconductor switch LS1 can be closed, for which purpose it can be driven with a drive voltage VA1. As a result, a current flow can form from the supply voltage +UB, through the coil and the semiconductor switch LS1, to ground GND. The path section via the diodes ZD1 and D1 is blocked because the diode D1 is reverse-biased. A change in the state of the semiconductor switch HS1 does not cause any changes in the current flow since this current through the semiconductor switch HS1 is likewise blocked by the diode D1. In accordance with a weak current quenching method, the semiconductor switch LS1 is opened by the drive voltage VA1 being put at a low potential. The semiconductor switch HS1 is closed by a drive voltage VA2 with a low potential being applied to the gate of said semiconductor switch. The magnetic energy in the coil L_coil then drives a current through the diode D1 in the forward direction of said diode, further through the open semiconductor switch HS1 and back to the coil L_coil, wherein the internal resistance R_coil of said coil is also effective in the freewheeling circuit produced in this way. The resistances in the freewheeling circuit have the effect that the current through the coil is slowly weakened, as shown in FIG. 7 by a drop after a peak value approximately at 0.0035 second. Furthermore, a strong quenching method can be used in the drive circuit by both the semiconductor switch LS1 and also the semiconductor switch HS1 being switched off. Current through the coil L_coil can now no longer pass across a freewheeling circuit via the semiconductor switch HS1 and therefore flows through the Zener diode ZD1 which has a higher back emf than the semiconductor switch HS1. Owing to the current flow through the Zener diode, power is lost at said Zener diode which draws energy from the coil L_coil, this in turn leading to a rapid drop in the coil current. This rapid drop can be seen by the steep drop in the current curve in FIG. 7 at 0.0065 second at present. The coil current can be reduced to zero in a short time in this way. It is clear to a person skilled in the art that other semiconductors can also be used instead of said types of semiconductor, in particular for the semiconductor switches. A change in the types of semiconductor can be compensated for by a corresponding change in the drive potentials in order to retain the functionality.

Figure 5B:
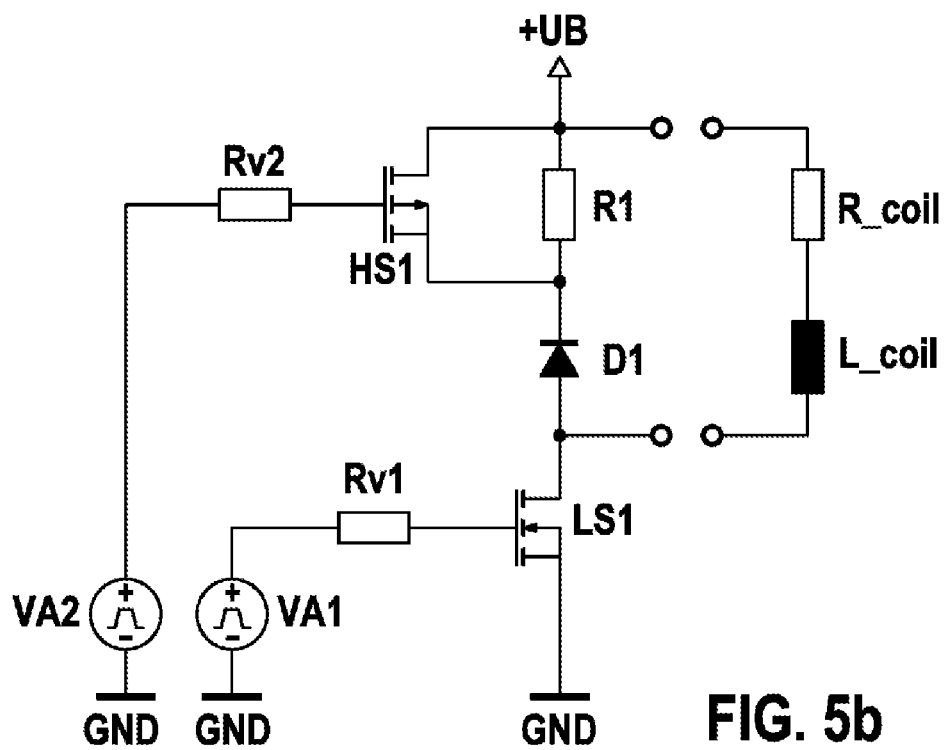
FIG. 5b shows a second embodiment of a drive circuit according to the invention.

FIG. 5b shows a second drive circuit according to the invention which differs slightly from the drive circuit of FIG. 5a. Only differences are discussed in the text which follows. Identical elements are provided with the same reference numerals and will not be separately explained again. In contrast to the drive circuit from FIG. 5a, the drive circuit of FIG. 5b has a non-reactive resistor R1 instead of the Zener diode ZD1. Therefore, the energy from the coil L_coil can be resistively converted into heat in the resistor R1 instead of at the semiconductor junction in the Zener diode.

Figure 5C:
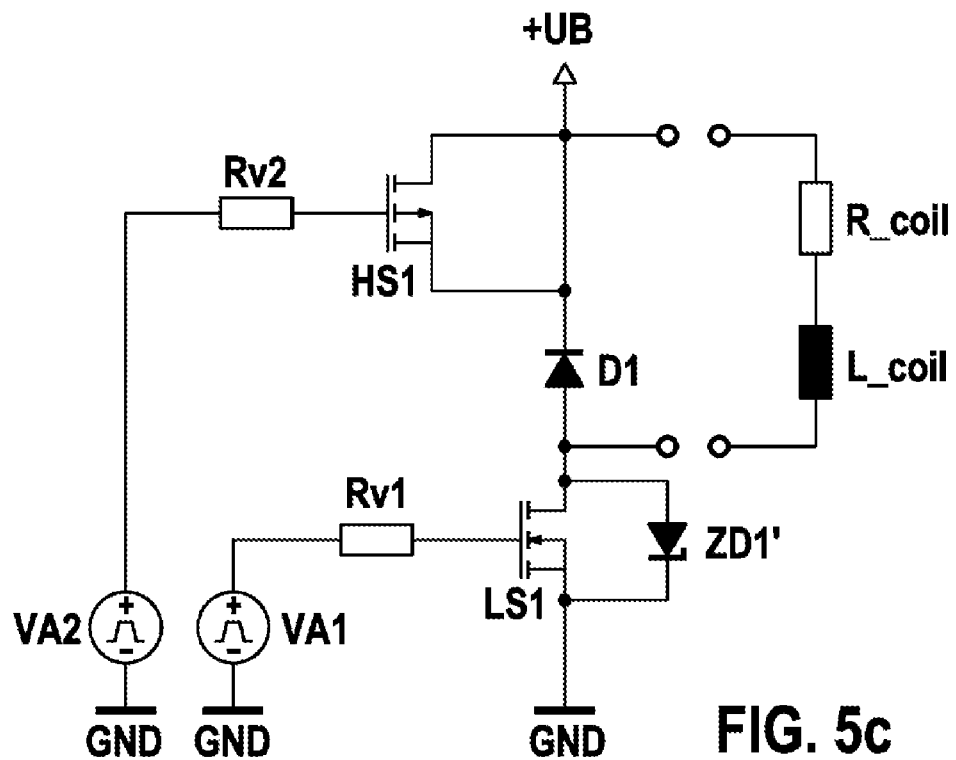
FIG. 5c shows a third embodiment of a drive circuit according to the invention.

FIG. 5c shows the embodiment of FIG. 5a with the difference that the Zener diode ZD1 is not connected between the drain and source of the semiconductor switch HS1, but rather between the drain and source of the semiconductor switch LS1 as Zener diode ZD1'. When the semiconductor switch LS1 is opened, current flows, driven by the coil L_coil, across a freewheeling circuit which comprises the Zener diode ZD1' and the current supply device which provides the voltage +UB.

Figure 5D:
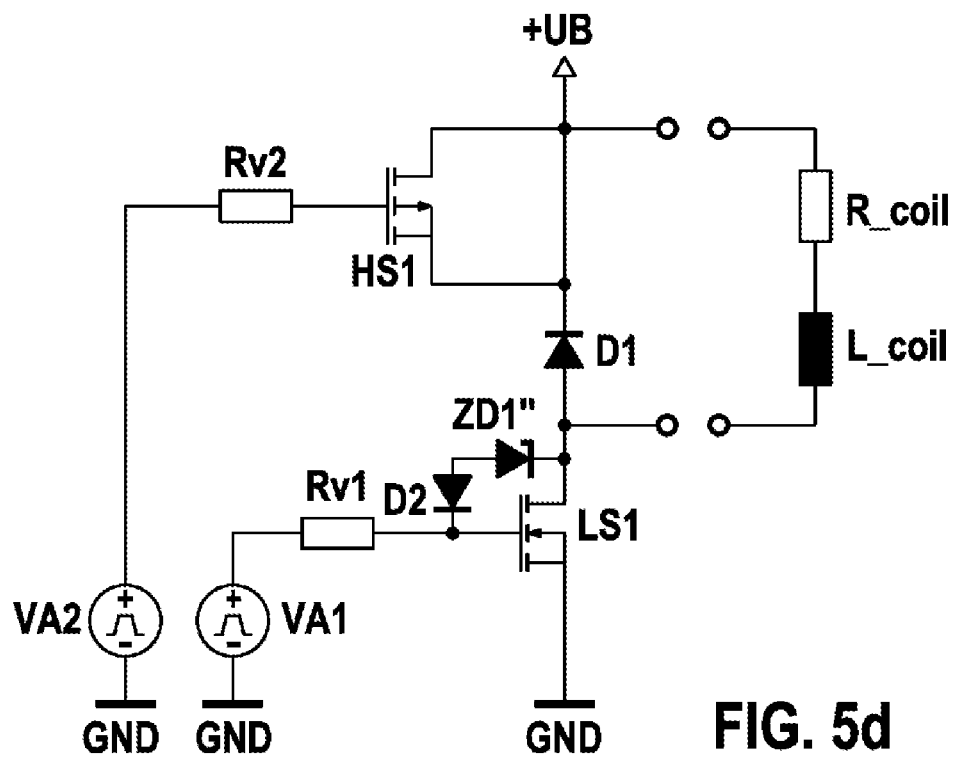
FIG. 5d shows a fourth embodiment of a drive circuit according to the invention.

FIG. 5d shows the embodiment of FIG. 5a with the difference that the Zener diode ZD1 is not connected between the drain and source of the semiconductor switch HS1, but rather between the drain of the semiconductor switch LS1 and the gate of the semiconductor switch LS1 as Zener diode ZD1". A further diode D2 which ensures that the semiconductor switch LS1 remains drivable by it being possible for voltage to also be built up at the gate of the semiconductor switch LS1 is also connected into said current path. In order to end the switch-on period of the semiconductor switch LS1, said semiconductor switch is opened. The semiconductor switch LS1 is embodied as an n-channel MOSFET, so that a low voltage is applied to the gate in this state. When the semiconductor switch HS1 is closed, a freewheeling circuit with weak current quenching is formed via the semiconductor switch HS1 and the diode D1. If the semiconductor switch HS1 is opened while the coil still has energy, the voltage across the cathode of the Zener diode ZD1" jumps to an increased potential on account of the coil voltage. As a result, the potential at the gate of the semiconductor switch LS1 is increased, so that the semiconductor switch LS1 is partially closed. This produces a freewheeling circuit with a strong quenching effect, in which freewheeling circuit the coil, the partially closed semiconductor switch LS1 with a resistor which converts current into heat to a considerable extent, and an energy supply device which provides the supply voltage potential +UB run. Therefore, a changeover can be made between a strong and weak quenching effect by changing the switching state of the semiconductor switch HS1.

The voltage between the source and gate of the semiconductor switch HS1 is produced from the interaction between the voltage across the diode D1, the voltage across the Zener diode ZD1', the voltage across the diode D1 and the voltage across the series resistor Rv2. In this case, the output of the voltage source VA2 has a low resistance. Owing to the half-closed semiconductor switch HS1, a voltage drops, this leading to rapid quenching of the coil current. As an alternative, the semiconductor switch HS1 can be fully closed, so that a weak quenching process is produced.

Figure 6:
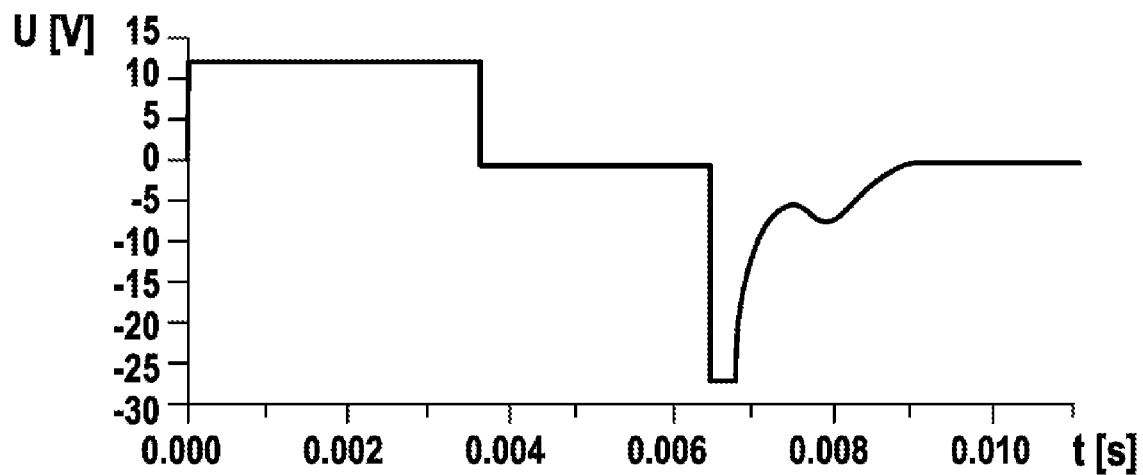
FIG. 6 shows a graph with a profile of the voltage across the coil in the case of driving by one of the drive circuits shown in FIGS. 5a and 5b with respect to time.

FIG. 6 shows the profile of a voltage across the coil L_coil in FIGS. 5a and 5b. A voltage of approximately 12 volts is applied over a time range of approximately three milliseconds. This corresponds to the switch-on period during the switch-on mode. During the application of the weak quenching method in the range of between 3.5 and 6.5 milliseconds, the voltage across the coil is somewhat less than 0 volt since, in spite of the current flow through said coil, the semiconductor switch and the forward-biased diode D1 have only a low diode voltage or a low internal resistance at the semiconductor switch HS1. At approximately 6.5 milliseconds, the drive circuit switches over to a mode with a strong quenching method. This produces a highly negative voltage which is considerably greater than the applied supply voltage +UB. After a few hundred microseconds, the voltage returns approximately asymptotically to approximately 0 volt.

FIG. 7 shows the current profile during operation of one of the drive circuits of FIGS. 5a and 5b. An approximately constant increase in the current up to a current peak is produced in a switch-on mode from 0 to 3.5 milliseconds. During execution of the weak quenching method, the coil current slowly reduces by approximately ¾ of the maximum value at 3.5 milliseconds. At 6.5 milliseconds, the mode of the drive circuit switches over to a strong quenching method. The current drops to 0 within a few hundred microseconds and remains there.

Figure 8A:
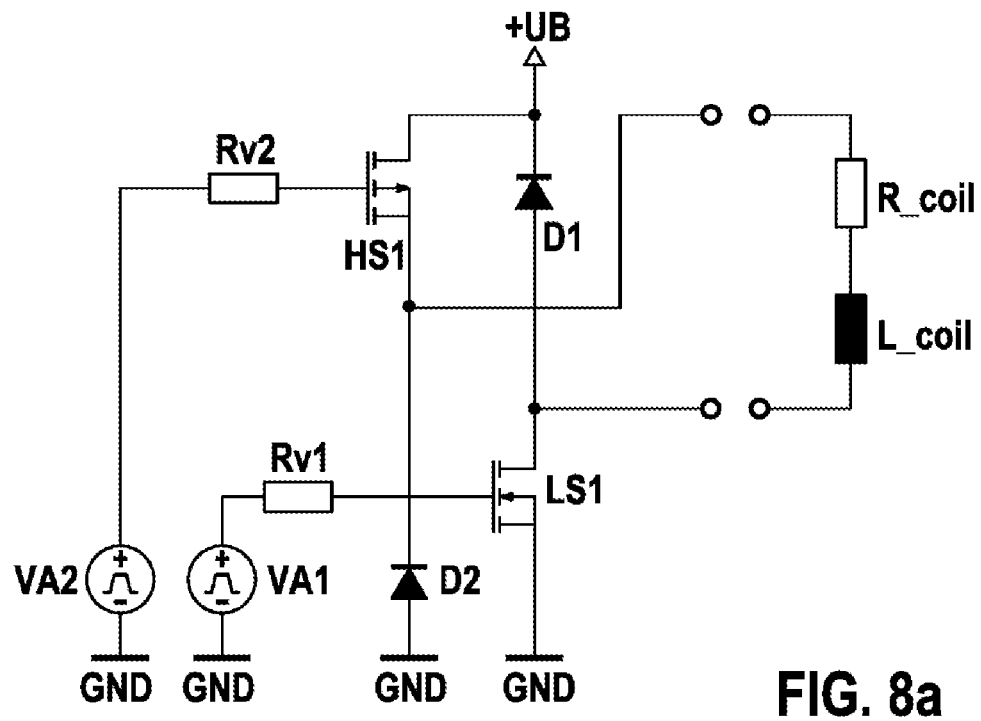
FIG. 8a shows a fifth embodiment of a drive circuit according to the invention with energetic recovery of coil current into a current supply device.
Figure 10:
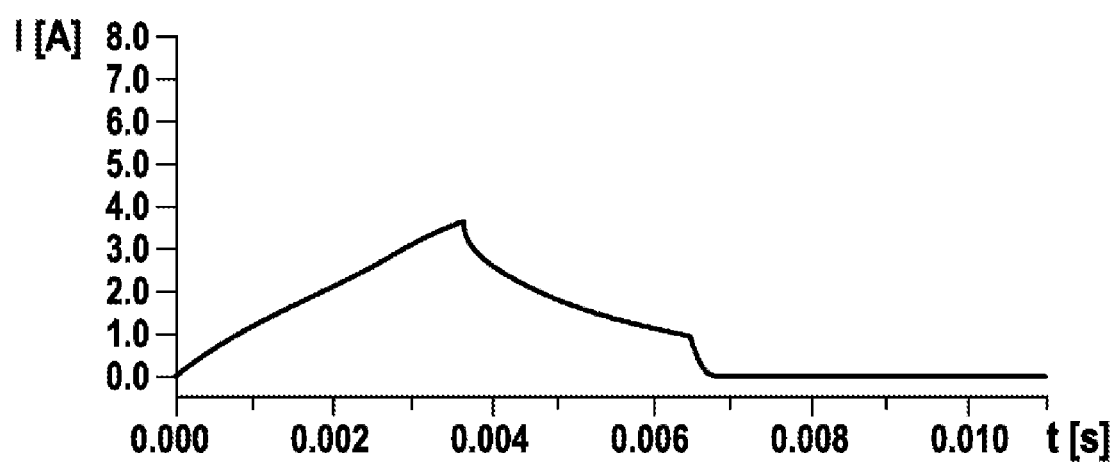
FIG. 10 shows a graph with a current flow with respect to time, which current flow results from the voltage, shown in FIG. 6, across the coil, wherein the same time period as in FIG. 6 is illustrated.

FIG. 8a shows a fifth embodiment of the invention in the form of a drive circuit which can feed coil current back to a current supply device which supplies the drive circuit with the supply voltage +UB. In terms of the basic design, the drive circuit is an H bridge circuit. In the branch of the bridge illustrated on the left-hand side in FIG. 8a, there is a semiconductor switch HS1 on the side of the supply voltage +UB. A conventional reverse-biased diode D2 is connected in series with said semiconductor switch in the left-hand branch. The right-hand branch of the H bridge is of similar design to the left-hand branch, but the diode D1, which is likewise reverse-biased with respect to the supply voltage +UB, is connected to the supply voltage +UB. However, the semiconductor switch LS1 is connected to ground. Therefore, the semiconductor switch HS1 and the diode D1 are interconnected at the supply voltage +UB, while the diode D2 and the semiconductor switch LS1 are interconnected at ground GND. The coil L_coil is connected or can be connected to the voltage divider points of the two branches by way of the internal resistance R_coil. The semiconductor switches HS1 and LS1 can each be driven by means of a drive voltage VA1 and, respectively, VA2 via the respectively associated series resistor Rv1 or, respectively, Rv2. The semiconductor switch HS1 is a self-locking p-channel MOSFET, while the semiconductor switch LS1 is a self-locking n-channel MOSFET. It is also feasible to use other semiconductor switches here, wherein the drive logic can be matched to said semiconductor switches. In a switch-on mode, the two semiconductor switches HS1 and LS1 are switched on. Therefore, current can flow from the supply voltage +UB, via the semiconductor switch HS1, through the coil L_coil and further through the semiconductor switch LS1, to ground. As a result, an increasing current flow is generated in the coil L_coil. In a subsequent weak quenching method, one of the semiconductor switches HS1 and LS1 is switched off. The current through the coil passes through the open semiconductor switch and one of the diodes, specifically through the diode D1 when semiconductor switch LS1 is open and through the diode D2 when semiconductor switch HS1 is open. In each case, only one diode voltage and the internal resistance of the switched-on semiconductor switch are present in the freewheeling circuits, this leading to a slow reduction in the current flow through the coil L_coil. This is shown in FIG. 10 which illustrates the current flow I through the coil with respect to time t. Starting from a time of approximately 3.5 milliseconds up to a time at 6.5 milliseconds, a moderate drop in the voltage can be observed, this being produced by the operation of the weak quenching method. In order to carry out a strong quenching method, the two semiconductor switches LS1 and HS1 are switched off. As a result, the current in the coil L_coil is still only able to pass in the forward direction of the diodes D1 and D2 which connect the coil in the charging direction between the supply voltage +UB and ground. A charging voltage by means of which energy is output into the energy supply device which provides the supply voltage +UB is produced across the coil L_coil. Owing to the sharp output of energy, the current in the coil L_coil is quenched very rapidly as shown in FIG. 10 by the sharp drop after start-up of the strong quenching method at 6.5 milliseconds. In this way, the energy in the coil is not converted into lost heat, but rather fed back into the current supply device.

Figure 8B:
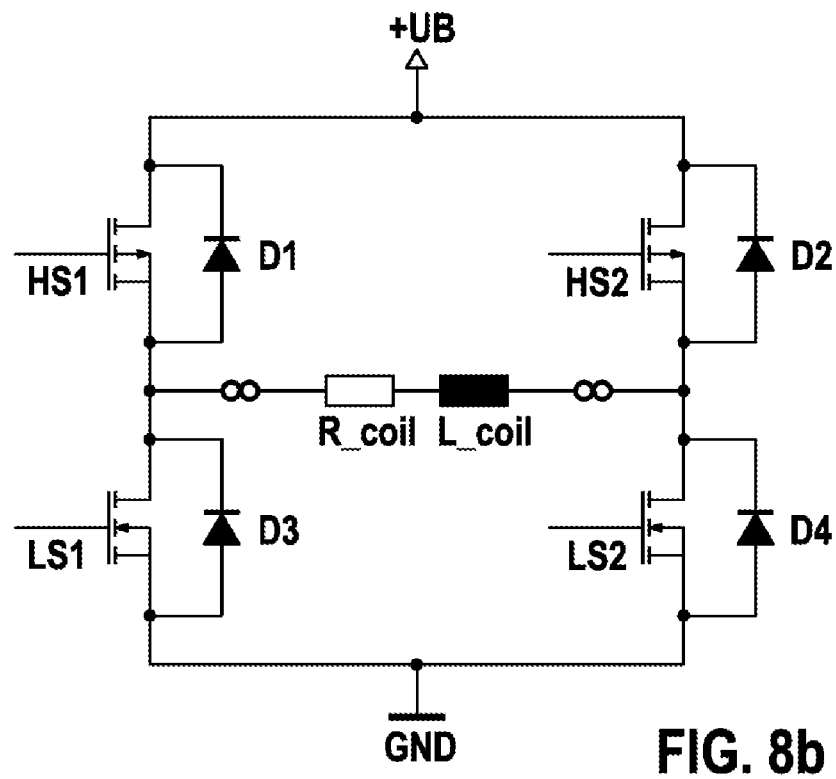
FIG. 8b shows a sixth embodiment of a drive circuit according to the invention with energetic recovery of coil current into a current supply device.

FIG. 8b shows a sixth embodiment of the invention in the form of a drive circuit. The drive circuit is designed as an H bridge, wherein the two branches of the H bridge each have two semiconductor switches, specifically HS1 and LS1 in the left-hand branch, and HS2 and LS2 in the right-hand branch. The coil L_coil, together with its internal resistance R_coil, is connected between the voltage divider points between the semiconductor switches HS1 and LS1 and, respectively, HS2 and LS2. The coil can be removable from the circuit, for example by means of plug contacts. The H bridge is connected between a supply voltage +UB and ground GND. A conventional diode D1, D2, D3 and, respectively, D4 is connected in parallel with each of the semiconductor switches HS1, HS2, LS1 and LS2, wherein the diodes are connected to the source and drain in each case. The diodes are reverse-biased with respect to the supply voltage +UB. In a switch-on mode, either the semiconductor switches HS1 and LS2 or the semiconductor switches HS2 and LS1 are switched on. A current path is created from the supply voltage +UB, through the coil, to ground GND via the semiconductor switches HS1 and, respectively, HS2 which are each connected to UB and are switched on and via the complementary semiconductor switches LS2 and, respectively, LS1 which are likewise switched on. An increasing current flow is generated in the coil L_coil owing to the supply voltage +UB which is applied to the coil L_coil. The current in the coil is directed to the tight-hand side in FIG. 8b when the semiconductor switches HS1 and LS2 are switched on, while the current is directed to the left-hand side when the semiconductor switches HS2 and LS1 are switched on. In order to produce weak current quenching of a coil current, the semiconductor switches LS1 and respectively LS2 can be switched on and HS1 and HS2 can be switched off. As an alternative, the semiconductor switches HS1 and, respectively, HS2 can be switched on and LS1 and LS2 can be switched off. This produces a freewheeling circuit which contains the coil internal resistance R_coil and the internal resistances of a semiconductor switch and a diode. This leads to a slow reduction in the coil current. As has already been described with reference to FIG. 8a this is shown between times 3.5 milliseconds and 6.5 milliseconds in FIG. 10. For operation in the strong current quenching method, all four semiconductor switches HS1, HS2, LS1 and LS2 are switched off. The coil current can flow only in the forward direction through two of the diodes into the current supply device which provides the supply voltage +UB, specifically through the diodes D1 and D4 in the case of a current which is directed to the left-hand side through the coil L_coil, and the diodes D2 and D3 in the case of a current which is directed to the right-hand side through the coil L_coil. Energetic recovery of the coil current into the current supply device takes place in this case.

The semiconductor switches HS1 and HS2 are self-locking p-channel MOSFETs, while the semiconductor switches LS1 and LS2 are self-locking n-channel MOSFETs. However, other types of semiconductor switch can also be used, wherein the drive logic can be accordingly adapted.

Figure 9:
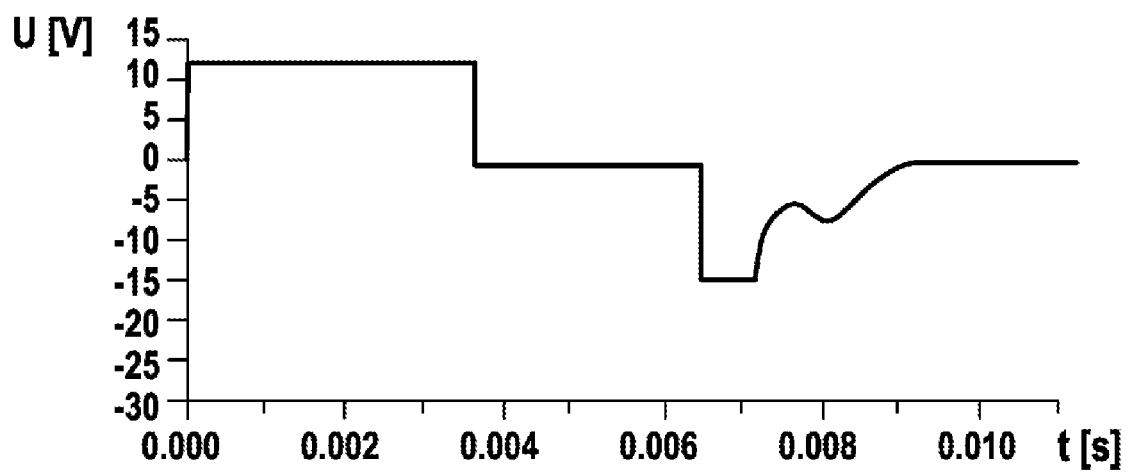
FIG. 9 shows a graph with a profile of the voltage across the coil in the case of driving by one of the drive circuits, shown in FIGS. 5a and 5b, with respect to time.

FIG. 9 shows a graph of a voltage across the coil with respect to time t. During a switch-on mode between 0 seconds and 3.5 milliseconds, the supply voltage +UB is applied to the coil. After the end of the switch-on period at 3.5 milliseconds, the voltage U drops virtually to 0. Said voltage is slightly negative on account of the internal resistances of the open semiconductor switches. After the strong current quenching method comes into force, the voltage drops very sharply, wherein it can reach negative values which are greater than the magnitude of the supply voltage +UB. At a highly negative voltage of this kind, the voltage at least approximately asymptotically approximates 0 volt.

FIG. 10 shows a graph in which a current through the coil is illustrated with respect to time, wherein the same time period as in FIG. 9 is illustrated. Said graph shows that there is an approximately constant increase in the current intensity starting from the time 0 seconds up to a time of 3.5 milliseconds. This corresponds to the switch-on mode of the drive circuits in FIGS. 8a and 8b. A weak current quenching method is used between times 3.5 milliseconds and 6.5 milliseconds, as a result of which the current intensity I slowly drops to approximately ¾ of a peak value at 3.5 milliseconds. At a time of 6.5 milliseconds, the drive circuits of FIGS. 8a and 8b switch over to a strong quenching method. This causes a sharp drop in the current within a few hundred microseconds and a subsequent asymptotic approximation to a current-free state, wherein only very low current intensities occur.

The invention claimed is:

1. A method for operating a piston pump which is driven by a coil (1) of an electromagnet, wherein a piston (2) of the piston pump is moved against a restoring force by the electromagnet, the method comprising:
   applying a voltage (U) from a source to the coil (1) for a switch-on period, causing a current (I) to flow through the coil (1) and causing the piston (2) to accelerate and reach a stop (8);
   applying, for a hold-time period directly following the switch-on period, a weak quenching method such that the current (I) flowing through the coil (1) decreases over time while the coil (1) maintains holding the piston (2) against the stop (8);
   applying, for an operation period directly following the hold-time period, a strong quenching method such that the current (I) flowing through the coil (1) decreases more rapidly over time than in the weak quenching method, releasing the piston (2) from the stop (8);
   wherein the switch-on period of the electromagnet is ended as soon as a movement of the piston (2) against the stop (8) is automatically identified.

2. The method as claimed in claim 1, characterized in that quenching of the current (I) in the coil (1) with the weak quenching method is implemented by the coil (1) being short-circuited via an open semiconductor switch (HS1, HS2, LS1, LS2).

3. The method as claimed in claim 1, wherein, during the operation period where the strong quenching method is put into effect, the restoring force moves the piston (2) away from the stop.

4. The method as claimed in claim 1, characterized in that the quenching of the current in the coil (1) with the strong quenching method is implemented by the coil (1) being short-circuited via a resistor (R1).

5. The method as claimed in claim 1, characterized in that, in the strong quenching method, energy is fed back into an energy supply device.

6. The method as claimed in claim 1, characterized in that the switch-on period is adjusted depending on a required volume flow.

7. The method as claimed in claim 1, characterized in that the switch-on period is adjusted depending on the voltage (U) which is applied to the coil (1).

8. The method as claimed in claim 1, characterized in that a drive frequency of the piston pump is adjusted depending on a required volume flow.

9. An electrical circuit arrangement for operating a piston pump which is driven by a coil (1) of an electromagnet and comprises a piston (2), wherein the circuit arrangement comprises a semiconductor switch device comprising at least two semiconductor switches (HS1, HS2, LS1, LS2), wherein the coil (1) is connected into a current path between a current source (+UB) and a current sink (GND) of an energy supply device in a switch-on operating mode by the semiconductor switch device, so that the piston (2) is accelerated toward a stop (8), and the coil (1) is disconnected from the current path for the switch-on operating mode in a holding operating mode with weak current quenching by the semiconductor switch device, and is connected into a freewheeling circuit by one or more semiconductor switches (HS1, HS2, LS1, LS2), maintaining the piston (2) against the stop (8), and, in an operating mode with strong current quenching, is configured to connect the coil (1) into the freewheeling circuit, which comprises an energy absorption device, by the semiconductor switch device, releasing the piston (2) from the stop (8), wherein the switch-on period of the electromagnet is ended as soon as a movement of the piston (2) against the stop (8) is automatically identified.

10. An electrical circuit arrangement for operating the piston pump which is driven by a coil (1) of an electromagnet and comprises the piston, characterized in that the circuit arrangement is configured to carry out the method as claimed in claim 1.

11. The piston pump which is driven by the coil (1) of the electromagnet and comprises a drive device, characterized in that the drive device comprises the electrical circuit arrangement as claimed in claim 9.

12. The electrical circuit as claimed in claim 9, wherein the resistor (R1), is a non-reactive resistor (R1).

13. The method as claimed in claim 1, characterized in that the quenching of the current in the coil (1) with the strong quenching method is implemented by the coil (1) being short-circuited via a semiconductor element with a semiconductor contact resistance.

14. The method as claimed in claim 13, wherein the semiconductor contact resistance is a Zener diode (ZD1).

* * * * *